United States Patent
Fillion et al.

(10) Patent No.: US 6,239,482 B1
(45) Date of Patent: *May 29, 2001

(54) INTEGRATED CIRCUIT PACKAGE INCLUDING WINDOW FRAME

(75) Inventors: Raymond Albert Fillion; William Edward Burdick, Jr., both of Niskayuna, NY (US); Ronald Frank Kolc, Cherry Hill, NJ (US); James Wilson Rose, Schenectady; Glenn Scott Claydon, Wynantskill, both of NY (US)

(73) Assignee: General Electric Company, Schenectady, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/334,572

(22) Filed: Jun. 21, 1999

(51) Int. Cl.[7] ............ H01L 23/02; H01L 23/053; H01L 23/48

(52) U.S. Cl. ............ 257/678; 257/700; 257/792; 257/783

(58) Field of Search .............. 257/678, 700, 257/792, 693, 729, 783; 438/106, 121, 118

(56) References Cited

U.S. PATENT DOCUMENTS

| 4,096,521 | 6/1978 | Spanjer | 257/787 |
|---|---|---|---|
| 4,835,704 | 5/1989 | Eichelberger et al. | 364/490 |
| 4,894,115 | 1/1990 | Eichelberger et al. | 156/643 |
| 5,250,843 | 10/1993 | Eichelberger | 257/692 |
| 5,324,687 | 6/1994 | Wojnarowski | 438/107 |
| 5,353,498 | 10/1994 | Fillion et al. | 29/840 |
| 5,359,496 | 10/1994 | Kornrmpf et al. | 361/795 |
| 5,434,751 | 7/1995 | Cole, Jr. et al. | 361/792 |
| 5,497,033 | 3/1996 | Fillion et al. | 257/723 |
| 5,527,741 | 6/1996 | Cole et al. | 438/107 |
| 5,532,512 | 7/1996 | Fillion et al. | 257/686 |
| 5,569,487 | 10/1996 | DeVre et al. | 427/81 |
| 5,637,922 | 6/1997 | Fillion et al. | 257/728 |
| 5,675,310 | 10/1997 | Wojnarowski et al. | 29/621 |
| 5,683,928 | 11/1997 | Wojnarowski et al. | 438/385 |
| 5,703,400 | 12/1997 | Wojnarowski et al. | 257/723 |
| 5,736,448 | 4/1998 | Saia et al. | 438/393 |
| 5,888,837 | * 3/1999 | Fillion et al. | 438/15 |

OTHER PUBLICATIONS

"Microelectronics Packaging Handbook" by R.R. Tummala and E.J. Rymaszewski, pp. iii and 42–47, 530–535, 736–741 (1989).

* cited by examiner

Primary Examiner—Eddie C. Lee
Assistant Examiner—Jhihan B. Clark
(74) Attorney, Agent, or Firm—Ann M. Agosti; Jill M. Breedlove

(57) ABSTRACT

An integrated circuit package includes at least one integrated circuit element coupled to a polymer film; a window frame coupled to the polymer film and surrounding the at least one integrated circuit element; and encapsulant material positioned between the at least one integrated circuit element and the window frame.

26 Claims, 8 Drawing Sheets

US 6,239,482 B1

INTEGRATED CIRCUIT PACKAGE INCLUDING WINDOW FRAME

BACKGROUND OF THE INVENTION

A variety of packaging approaches have been developed to address problems associated with packaging and interconnection of high pin count, high speed, high power digital semiconductor integrated devices. High pin counts, ranging from a few hundred input/output (I/O) pins to more than one thousand I/O pins, stress the capabilities of standard packages to efficiently connect the devices to a next level of interconnection (typically a printed circuit board (PCB)). One reference book which describes conventional packaging approaches, for example, is Tummala and Rymaszewski, *Microelectronics Packaging Handbook,* Van Nostrand Reinhold, New York, 1988.

Perimeter lead devices require shrinking lead pitch and lead widths which create the limitations of: package sizes growing by the square of the I/O count, less tolerance in lead position and distortion, reduced placement tolerance in mounting the devices onto PCBs, and larger PCB area and costs.

Area array packages such as land grid arrays (LGAs) and ball grid arrays (BGAs) address several of the above described limitations of perimeter lead devices. LGA and BGA packages use an array of I/O sites to increase the number of I/O connections on a package while maintaining a larger pad pitch and a smaller package footprint. Typical pad pitches range from about 1.27 mm to about 1.5 mm. As the I/O connection count continues to increase, LGA and BGA packages increase in size and expense.

Chip Scale packaging (CSP) techniques can be used to reduce the device package to a size not much larger than the integrated circuit chip. Some of the techniques feature fine line pitch area array I/O pads to meet requirements of high pin count devices. Area array CSPs have pad pitches ranging from about 0.5 mm to about 1.0 mm, permitting four to ten times the I/O connection density as LGA or BGA packaged devices.

A flexible layer based CSP packaging approach using multi-chip module (MCM) techniques has been found to be highly efficient in packaging low to moderate I/O connection count devices and be capable of supporting 0.5 mm pitch arrays of pads within the footprint of a circuit chip or a footprint slightly larger than the chip. The process can alternatively be used to fan the I/O connections out to a larger pitch array to accommodate I/O limits of a PCB.

Although high I/O count CSP type packaged devices with tight pitches are area efficient and cost effective, the assembly of these devices on a PCB creates severe design constraints for an associated PCB. For example, a 400 I/O CSP with a 0.5 mm grid would include a solid array of 20 by 20 I/O pads in a tight footprint. The PCB needed to interconnect such a package would require expensive microvias (small blind holes between PCB interconnect layers) and fine pitch lines on a number (about 8–10) of layers with 75–100 μm line widths and spaces and 50–75 μm vias.

Furthermore, using CSP technologies can be expensive due to the fact that the package cost is primarily based on the processing area required by the package. Typically, in these embodiments, the chip is encapsulated. As the package footprint increases, warping and other stresses can occur in the encapsulation.

Thus, there is a particular need for a package and a fabrication method for high pin count devices which do not over-stress interconnect capabilities of a PCB.

BRIEF SUMMARY OF THE INVENTION

Briefly, in accordance with one embodiment of the present invention, an integrated circuit package includes at least one integrated circuit element coupled to a polymer film; a window frame coupled to the polymer film and having at least one opening surrounding the at least one integrated circuit element; and encapsulant material positioned between the at least one integrated circuit element and the window frame.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawings, where like numerals represent like components, in which:

DETAILED DESCRIPTION OF THE INVENTION

Figure 1:
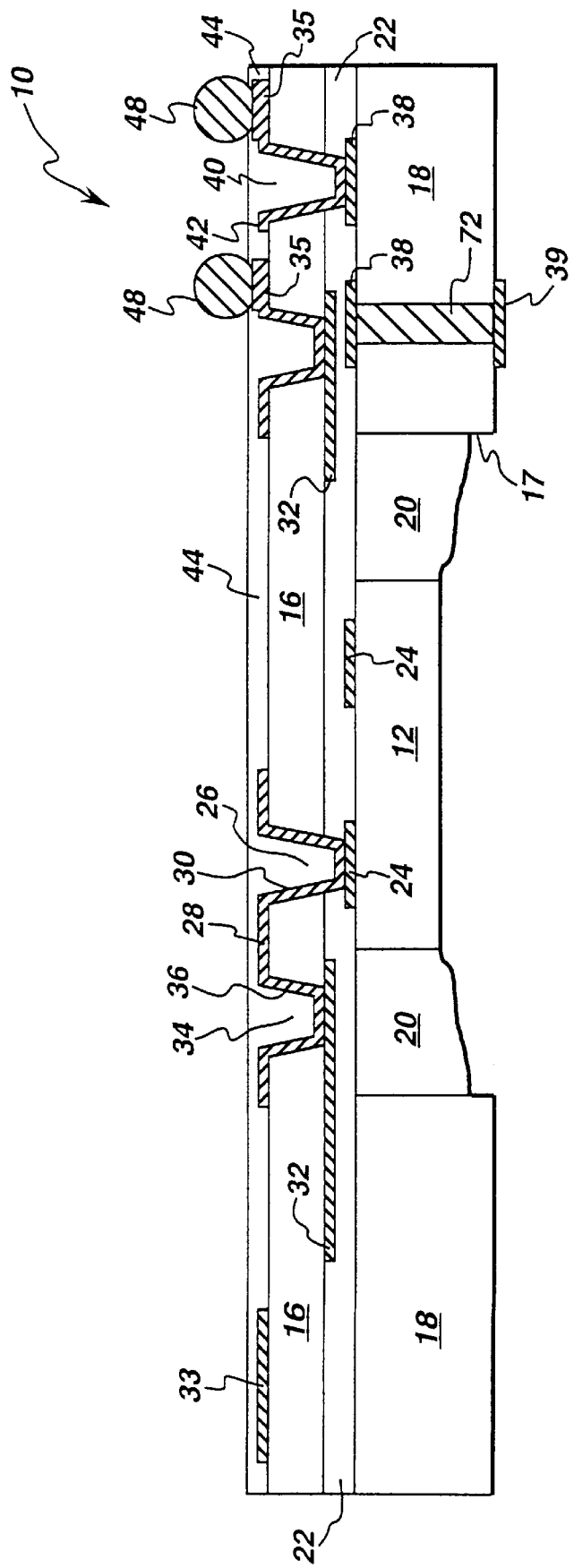
FIG. 1 is a sectional side view of one embodiment of the present invention.
Figure 2:
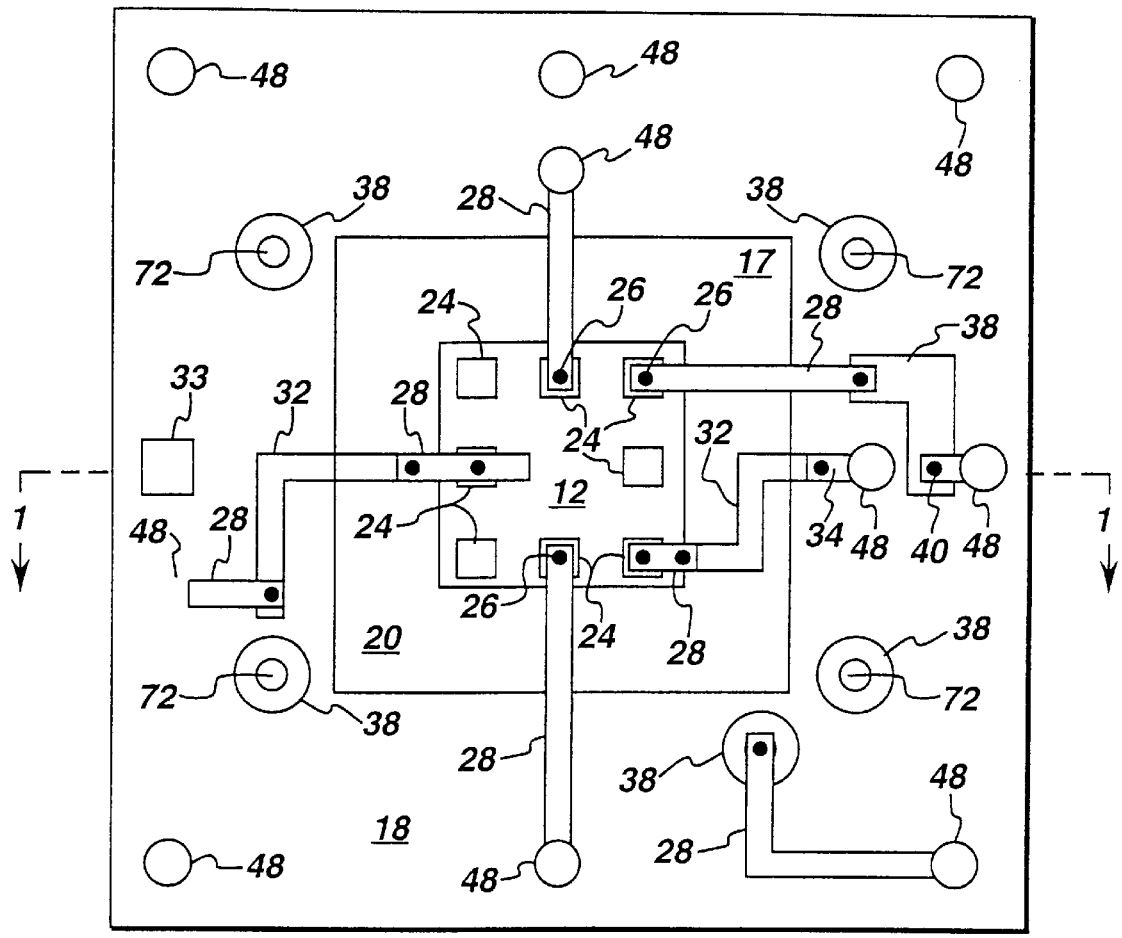
FIG. 2 is a top view of an embodiment of the present invention.

In the apparatus of FIGS. 1 and 2, the present invention is embodied in sectional side and top views of an integrated circuit package 10 including at least one integrated circuit element (12, in FIG. 1) coupled to a polymer film 16, a window frame 18 coupled to the polymer film and having at least one opening surrounding the at least one integrated circuit element, and encapsulant material 20 positioned between the at least one integrated circuit element and the window frame.

Figure 3:
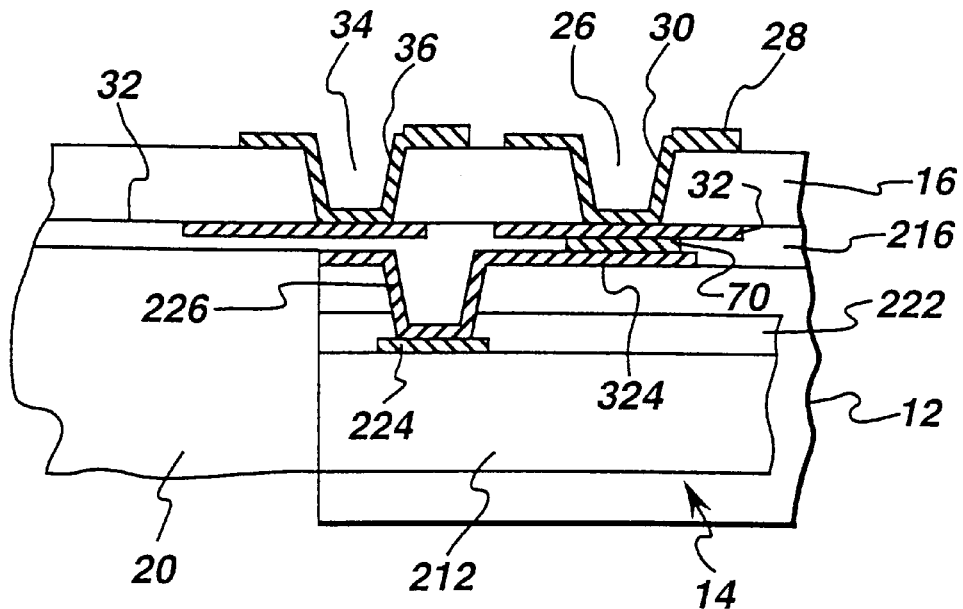
FIGS. 3 and 4 are sectional side views of alternative connection pad coupling embodiments to that shown in FIG. 1.

The at least one integrated circuit element may comprise at least one unpackaged integrated circuit device 12, as shown in FIG. 1, or at least one packaged integrated circuit device 14, as shown in FIG. 3.

Polymer film 16 may comprise a polymer such as a polyimide, for example, and typically has a thickness ranging from about 10 to about 50 μm.

Window frame 18 may comprise a polymeric material such as an epoxy and preferably includes filler material such as fiber glass fibers or small inorganic particles of silicon carbide, ceramic, or aluminum nitride, for example. The specific materials are selected for a particular design based on the desired coefficient of thermal expansion, rigidity, or other desired mechanical properties. One or more openings 17 can be formed in the window frame by molding, machining, or punching, for example.

Adhesive layer 22 preferably comprises a polymeric adhesive such as a thermoset polyimide or polyimide blend capable of coupling the at least one integrated circuit element and the window frame to the polymer film. In one embodiment, the adhesive layer is applied uncured to the polymer film, the window frame is applied to the adhesive layer, the at least one integrated circuit element is applied to the adhesive layer, and the adhesive layer is cured.

Encapsulant 20 can be dispensed into the gap between the integrated circuit element and the window frame and, if desired, over the back side of the integrated circuit element. The risk of warpage for this embodiment as compared to an embodiment wherein an encapsulant defines the entire footprint is far less. The encapsulant material may comprise a filled epoxy or a silicon polymer, for example. Other examples of appropriate materials are described in Fillion et al, U.S. Pat. No. 5,353,498, and include, for example, aliphatic and aromatic polymers including thermoplastic and thermoset type polymers and blends of various polymers such as polyetherimide resins, acrylates, polyurethanes, polytetrafluoroethylenes, epoxies, benzocyclobutene (BCB), polyimides, or other polymers preferably including filler material in a configuration of particles, fibers, screens, mats, or plates of inorganic particles of glass, SiC, $Al_2O_3$, or AlN, particles of diamond or graphite, or metal particles of silver or copper. In certain embodiments, it may be beneficial to simultaneously cure the encapsulant and the adhesive material.

In one embodiment, after adhesive layer 22 and encapsulant 20 are cured, vias 26 are formed in the polymer film and the adhesive layer with at least some vias extending to connection pads 24 of the at least one integrated circuit element, and a pattern of electrical conductors 28 is deposited on a surface of the polymer film facing away from the at least one integrated circuit element and the window frame. The pattern of electrical conductors includes portions 30 extending through the vias and being coupled to the connection pads.

Methods for forming vias and applying a pattern of electrical conductors are described in Eichelberger et al., U.S. Pat. No. 4,894,115 and Eichelberger et al., U.S. Pat. No. 4,835,704, for example. In one embodiment, the pattern of electrical conductors includes a buffer layer of metallization such as titanium or chromium with a layer of copper deposited thereover by sputtering and electroplating and an optional second buffer layer coating the copper. The pattern of electrical conductors can be deposited through a mask or as a solid sheet which is then patterned with photoresist, for example.

As an optional feature, pattern of electrical conductors 28 comprises a first pattern of electrical conductors and polymer film 16 includes one or more of second patterns of electrical conductors 32 and 33 which are preferably formed prior to coupling the polymer film to the integrated circuit package and window frame.

Second pattern of electrical conductors 32 can be formed on a surface of the polymer film facing the at least one integrated circuit element and the window frame in the same manner with similar processing steps as the first pattern of electrical conductors. Second vias 34 can be formed in the polymer film to extend to the second pattern of electrical conductors, and first pattern of electrical conductors 28 can include portions 36 extending through the second vias to the second pattern of electrical conductors.

An alternative or additional location for second pattern of electrical conductors 33 is on a surface of the polymer film facing away from the integrated circuit element and the window frame. This surface may additionally include a bonding patterns of electrical conductors 35 which typically comprise a multilayer embodiment of copper, nickel, and gold coupled to first pattern of electrical conductors 28 or second pattern of electrical conductors 33 and which can be deposited either prior to or after the application of first pattern of electrical conductors 28.

Another optional feature of the present invention is the window frame including at least one electrically conductive element 72 extending therethrough. In one embodiment, the electrically conductive elements 72 are molded into the window frame during fabrication. In another embodiment, holes are formed in the window frame and electrically conductive elements 72 are inserted or molded therein. Appropriate materials for electrically conductive elements 72 include metals such as copper, gold, aluminum, stainless steel, alloys such as palladium-gold, copper-molybdenum, copper tungsten, or metals or alloys with a surface coating of a material such as platinum, nickel, gold, or palladium, for example. Optional electrically conductive bonding areas 38 and 39 can be formed on the window frame on opposite sides of the electrically conductive elements to enhance electrical connections. The electrically conductive elements permit the placement of I/O pads on the opposite side of the package from the polymer layer.

Figure 5:
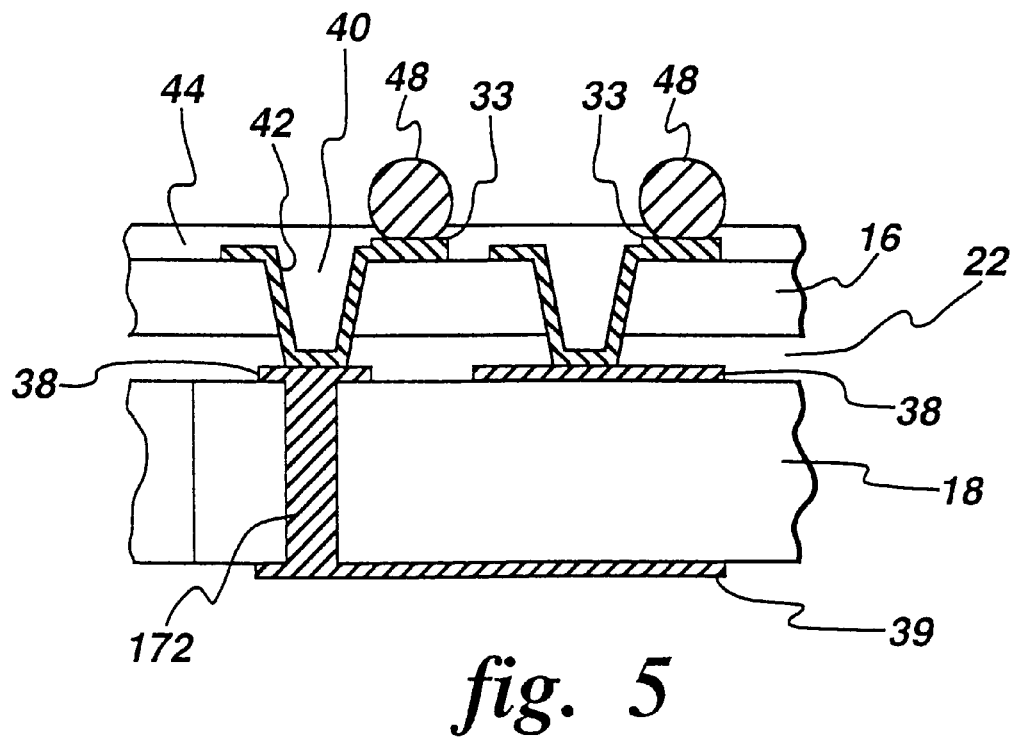
FIGS. 5 and 6 are sectional side views of alternative connection element coupling embodiments to that shown in FIG. 1.

As another optional feature, the window frame itself may include a third pattern of electrical conductors 38 on a surface of the window frame facing the polymer film which may comprise the same material or pattern as the bonding area to electrically conductive element 72. Third pattern of electrical conductors 38 can be used for power and ground distribution as well as signal routing or fanning out I/O pads. In one embodiment, the polymer film and the adhesive layer can have at least one third via 40 extending therethrough to the third pattern of electrical conductors, and the first pattern of electrical conductors may include at least one third portion 42 extending through the at least one third via to the third pattern of electrical conductors. As shown in FIG. 5, the electrically conductive elements can thus be coupled to the first pattern of electrical conductors in this manner.

As another optional feature, a polymeric passivation layer 44 can be applied on the polymer film and the pattern of electrical conductors. In one embodiment, the polymeric passivation layer comprises a polymer solder mask material such as available from Alpha Metals, Inc., New Jersey, USA or Dexter Electronic Materials, California, USA and includes passivation vias 46 extending to the first pattern of electrical conductors 28 or, if applicable, the bonding pattern of electrical conductors 35. Bonding pads 48 can be coupled through the passivation vias. In one embodiment, bonding pads 48 comprise solder spheres.

Figure 4:
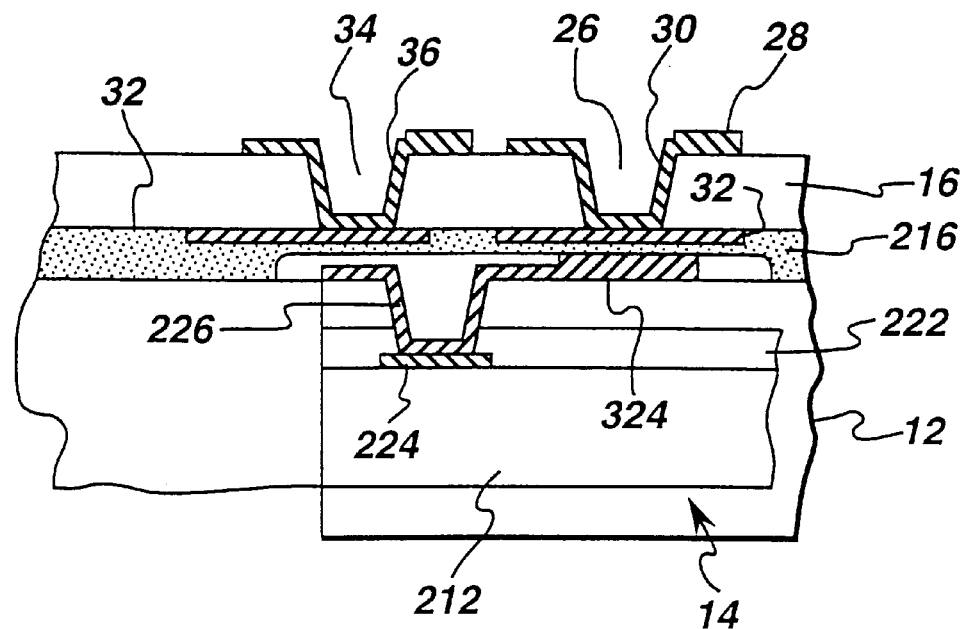

FIGS. 3 and 4 are sectional side views of alternative connection pad coupling embodiments to that shown in FIG. 1. Additionally, these figures illustrate an embodiment wherein the at least one integrated circuit element includes a packaged integrated circuit device 14.

In one embodiment, packaged integrated circuit device 14 includes an integrated circuit device 212 having a package polymer film 216 attached thereto with a package adhesive layer 222 in a similar manner as discussed above with respect to polymer film 16. Metallized vias 226 are formed in the package polymer film and adhesive and couple integrated circuit device pads 224 to integrated circuit element connection pads 324.

Figure 6:
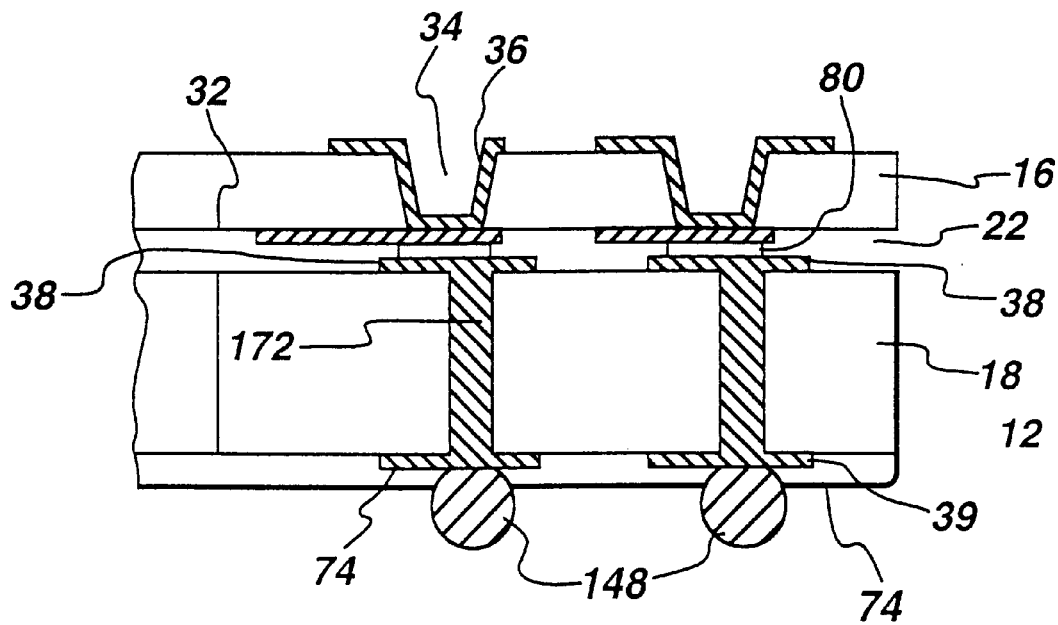

The embodiments of FIGS. 3 and 4 further illustrate an additional option which can be used with respect to the integrated circuit element 12 of FIG. 1 as well as the integrated circuit elements 14 of FIGS. 3 and 4 and the window frame electrically conductive element 72 of FIG. 6. In this embodiment, vias 26 and 34 in polymer film 16 can be preformed and metallized prior to coupling polymer film 16 with the integrated circuit element and window frame 18. Methods for forming polymer films with vias and pre-patterned metallization are described, for example, in Cole et al., U.S. Pat. No. 5,527,741.

In the embodiments of FIGS. 3 and 4, portions 30 of pattern of electrical conductors 28 extending through vias 26 to second pattern of electrical conductors 32 which is coupled by coupling means 70 or 22 to at least one of connection pads 324.

As shown in FIG. 3, the coupling means may comprise an electrically conductive adhesive 70. Alternatively, as shown in FIG. 4, the coupling means may comprise adhesive layer 22 if the adhesive layer comprises an anisotropic adhesive layer. In this embodiment, it is useful to apply a passivation layer 244 over any electrically conductive patterns in the integrated circuit element that are not desired to be coupled with an adjacent area of second pattern of electrical conductors on polymer film 16.

FIGS. 5 and 6 are sectional side views of alternative connection element coupling embodiments to that shown in FIG. 1. FIG. 5 is similar to that of FIG. 1 illustrating an embodiment wherein via 40 is positioned above electrically conductive element 72. FIG. 6 represents an embodiment wherein an electrically conductive adhesive 70 is used to couple the second and third patterns of electrical conductors 32 and 38. As discussed above with respect to FIG. 4 the adhesive layer 22 may comprise an anisotropic adhesive material and perform the coupling function without a separate electrically conductive adhesive 70.

As shown in FIG. 6, a polymeric passivation layer 74 can be applied over a surface of the window frame facing away from the polymer film through and bonding pads 148 can be attached to the electrically conductive element either directly or through bonding areas 39.

Figure 7:
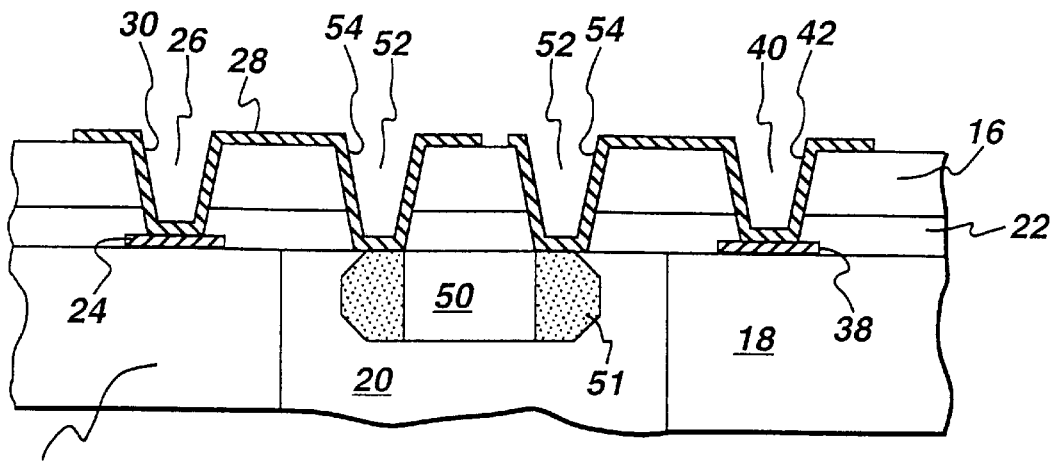
FIGS. 7–9 are sectional side views of embodiments including passive devices.
Figure 8:
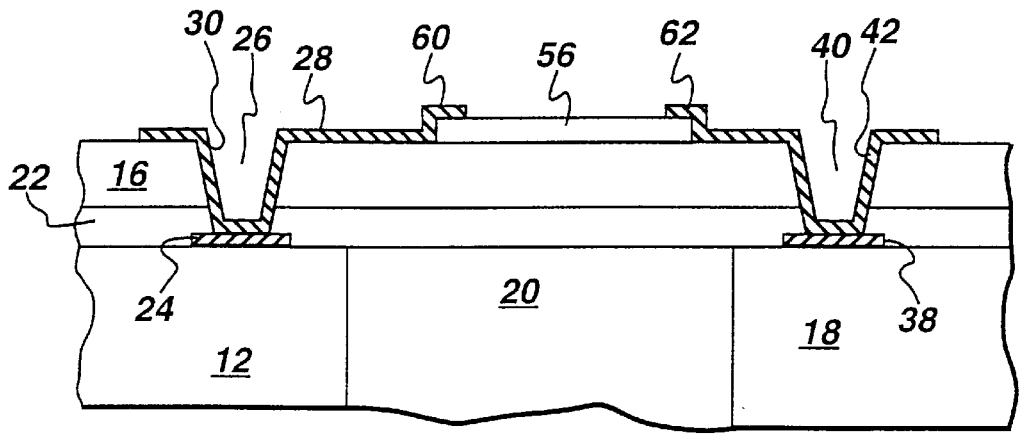
Figure 9:
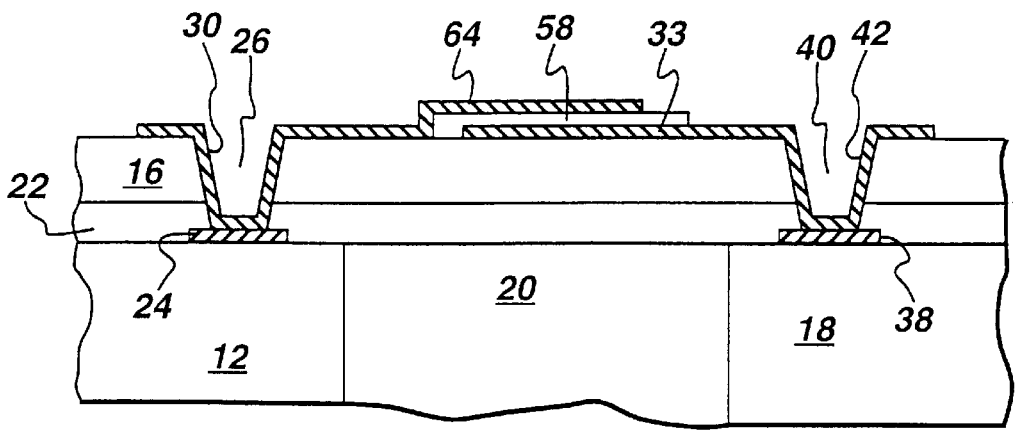

FIGS. 7–9 are sectional side views of embodiments including passive devices. FIG. 7 illustrates a discrete passive device 50, FIG. 8 illustrates a thin film resistor 56 formed on polymer film 16, and FIG. 9 illustrates a thin film capacitor 58 formed on polymer film 16.

Appropriate discrete passive devices include resistors, capacitors, inductors, or batteries with contact regions 51, for example. The passive devices can be coupled to polymer film 16 with adhesive layer 22 at the same time as integrated circuit element 12 and window frame 18 are coupled. In one embodiment, the polymer film and the adhesive layer include passive device vias 52 extending to the at least one passive electrical device, and the pattern of electrical conductors includes passive device portions 54 extending into the passive device vias.

The thin film resistors or capacitors of FIGS. 8 and 9 can be formed either prior to or after the coupling of the polymer film to the integrated circuit element. Thin film resistor 56 preferably comprises a thin tantalum nitride layer which, in one embodiment, is coupled by portions 60 and 62 of first pattern of electrical conductors 28. Commonly assigned Wojnarowski et al., U.S. Pat. Nos. 5,675,310 and 5,683,928 describe thin film resistors and fabrication methods, for example. In one embodiment, thin film capacitor 58 preferably comprises a portion of second pattern of electrical conductors 33 adjacent a portion of a dielectric material such as diamond-like-carbon adjacent a portion 64 of first pattern of electrical conductors 28. Methods for fabricating thin film capacitors are described, for example, in commonly assigned Saia et al., U.S. Pat. No. 5,736,448 and DeVre et al., U.S. Pat. No. 5,569,487.

Figure 10:
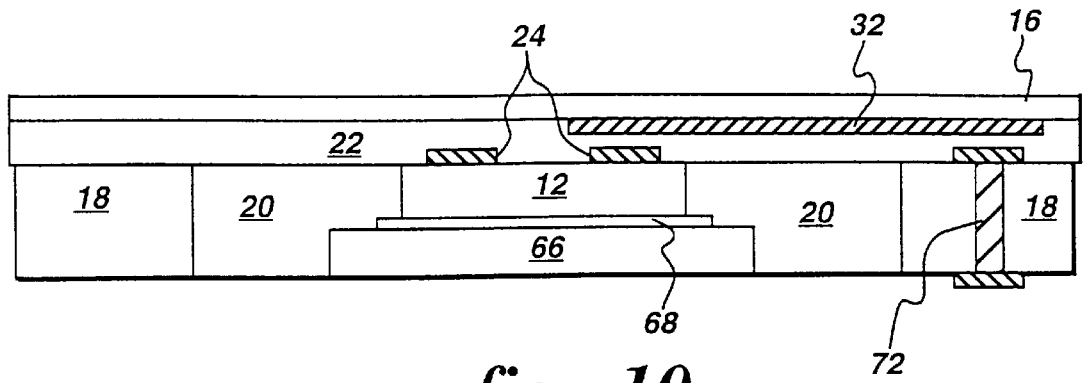
FIG. 10 is a sectional side view similar to that of FIG. 1 and further showing a thermal spacer.

FIG. 10 is a sectional side view similar to that of FIG. 1 and further showing a thermal spacer 66 coupled to a surface of the at least one integrated circuit element facing away from the polymer film. Thermal spacer 66 is a thermally conductive structure which may comprise high thermal conductivity materials such as metal, ceramic, or composite materials and may be bonded with a solder paste or a thermally conductive adhesive such as an epoxy filled with metal particles. Encapsulant 20 can also fill gaps between the thermal spacer and window frame 18.

FIG. 10 additionally illustrates an embodiment wherein no vias or first pattern of electrical conductors are needed. In this embodiment, second pattern of electrical conductors 32 can couple connection pad 24 to another connection pad or to an electrically conductive element 72 using an anisotropic adhesive 22 or a selectively applied electrically conductive adhesive such as shown in FIG. 6.

Figure 11:
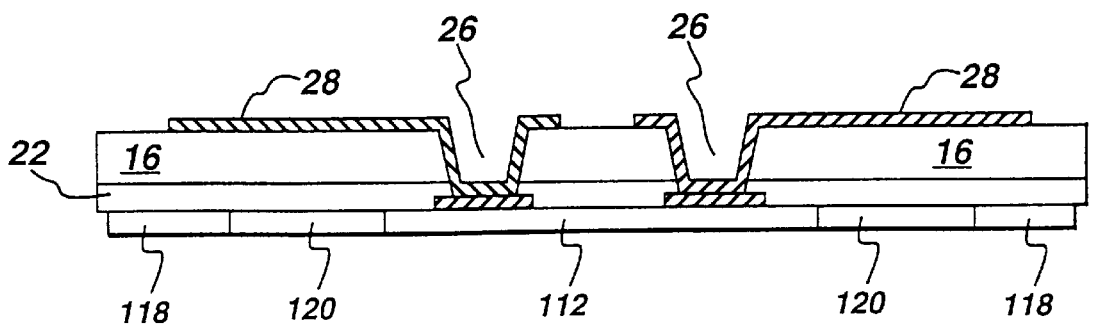
FIG. 11 is a sectional side view illustrating thinned integrated circuit elements.

FIG. 11 is a sectional side view illustrating thinned integrated circuit elements. Thinning permits the integrated circuit elements to be used in applications requiring thin or low volume packages. One example of a mechanical thinning techneque is described in Wojnarowski, U.S. Pat. No. 5,324,687, for example.

Figure 12:
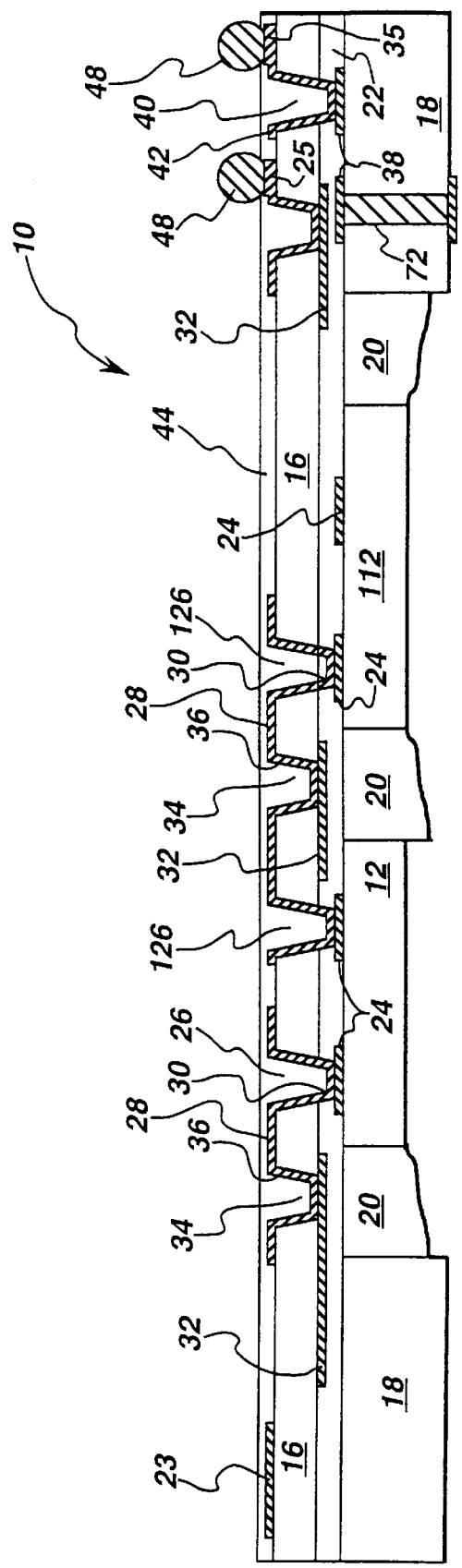
FIG. 12 is a sectional side view illustrating an embodiment of the present invention with multiple integrated circuit elements.

FIG. 12 is a sectional side view illustrating an embodiment of the present invention with multiple integrated circuit elements 12 and 112. Although FIGS. 1–11 were shown with a single integrated circuit element 12 or 14 for purposes of example, single or multiple integrated circuit elements can be included within window frame 18.

In the embodiment of FIG. 12, selected connect pads on one integrated circuit element 12 and on the other integrated circuit element 112 are electrically connected to first pattern of electrical conductors 28 by first vias 26. Optionally, selected connect pads 24 of one of the integrated circuits 12 or 112 can be electrically connected by first pattern of electrical conductors 28 to selected contact pads 24 of another integrated circuit 12 or 112. Window frame 18 encloses multiple integrated circuits 12 and 112 with encapsulant material 20 filling the areas between the integrated circuits 12 and 112 and the area between the integrated circuits 12 and 112 and the window frame 18.

Figure 13:
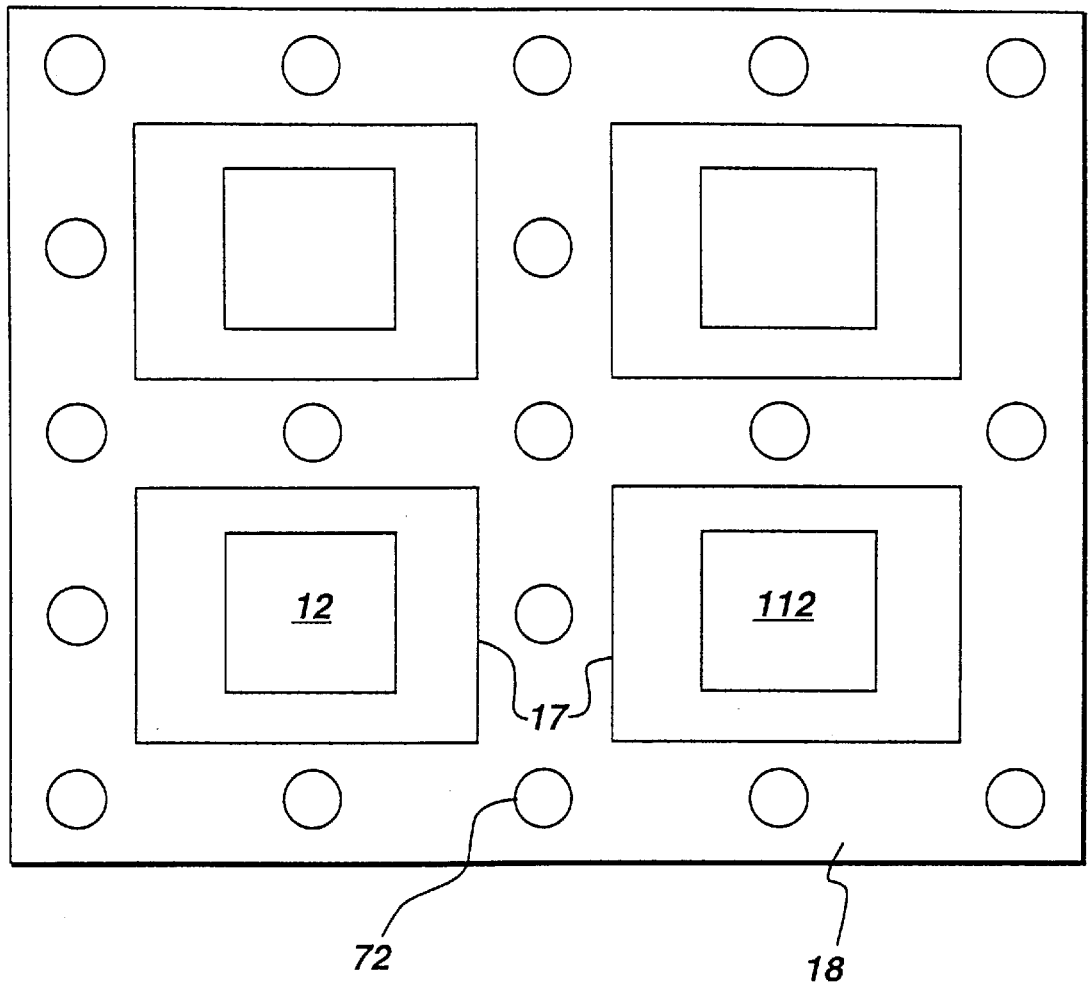
FIG. 13 is a top view illustrating an embodiment wherein a window frame includes multiple openings.

FIG. 13 is a top view illustrating an embodiment wherein window frame 18 includes multiple openings 17. One or more integrated circuit elements can be situated in each opening. This embodiment can be used for further reducing stress when a plurality of integrated circuit elements are present within a window frame, for forming a more robust package, and/or for incorporating additional electrically conductive elements 72.

While only certain preferred features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. An integrated circuit package comprising:
   a polymer film;
   at least one integrated circuit element having connection pads and having a connection pad surface coupled to the polymer film, the polymer film having vias extending therethrough to at least some of the connection pads;
   an integrated circuit package window frame coupled to the polymer film and having at least one opening surrounding the at least one integrated circuit element, the window frame including at least one electrically conductive element extending therethrough;
   polymeric encapsulant material positioned between the at least one integrated circuit element and the window frame;
   a pattern of electrical conductors on a surface of the polymer film facing the at least one integrated circuit device and the window frame and electrically coupling at least one of the connection pads to the at least one electrically conductive element.

2. An integrated circuit package (10) comprising:
   a polymer film;
   at least one integrated circuit element having connection pads and having a connection pad surface coupled to the polymer film, the polymer film having vias extending therethrough to at least some of the connection pads;
   an integrated circuit package window frame coupled to the polymer film and having at least one opening surrounding the at least one integrated circuit element;
   polymeric encapsulant material positioned between the at least one integrated circuit element and the window frame;
   a pattern of electrical conductors on a surface of the polymer film facing away from the at least one integrated circuit element and the window frame, the pattern of electrical conductors including portions extending through the vias and being coupled to the connection pads.

3. The package of claim 2 wherein the at least one integrated circuit element is at least one unpackaged integrated circuit device or at least one packaged integrated circuit device.

4. The package of claim 2 wherein the pattern of electrical conductors comprises a first pattern of electrical conductors and the vias comprise first vias and
   further including a second pattern of electrical conductors on a surface of the polymer film facing the at least one integrated circuit element and the window frame.

5. The package of claim 2 further including a polymeric passivation layer on the polymer film and the pattern of electrical conductors.

6. The package of claim 2 wherein the window frame includes at least one electrically conductive element extending therethrough.

7. The package of claim 2 further including at least one passive electrical device coupled to the polymer film.

8. The package of claim 2 wherein the polymer film includes at least one thin film passive electrical device.

9. The package of claim 2 further including a thermal spacer coupled to a surface of the at least one integrated circuit element facing away from the polymer film.

10. The package of claim 2 wherein the window frame includes at least one electrically conductive element extending therethrough, the pattern of electrical conductors being electrically coupled to the at least one electrically conductive element of the window frame.

11. The package of claim 2 wherein the pattern of electrical conductors comprises a first pattern of electrical conductors and the vias comprise first vias and
    further including second patterns of electrical conductors on opposing surfaces of the polymer film, the second patterns of electrical conductors being electrically coupled to the first pattern of electrical conductors.

12. The package of claim 2 further including a third pattern of electrical conductors on a surface of the window frame facing the polymer film.

13. The package of claim 3 further including an adhesive layer for coupling the at least one integrated circuit element and the window frame to the polymer film.

14. The package of claim 4 wherein at least some of the first vias and the portions of the first pattern of electrical conductors extending through the first vias extend to the second pattern of electrical conductors, and
    means for electrically coupling the second pattern of electrical conductors to at least one of the connection pads.

15. The package of claim 14 wherein the polymer film and the adhesive layer have at least one second via extending therethrough to the second pattern of electrical conductors and wherein the first pattern of electrical conductors includes at least one second portion extending through the at least one second via to the second pattern of electrical conductors.

16. The package of claim 15 wherein the window frame includes at least one electrically conductive element extending therethrough and wherein the second pattern of electrical conductors is electrically coupled to the at least one electrically conductive element.

17. The package of claim 15 further including a third pattern of electrical conductors on a surface of the window frame facing the polymer film.

18. The package of claim 15 wherein the pattern of electrical conductors comprises a first pattern of electrical conductors and the vias comprise first vias and
    further including a third pattern of electrical conductors on a surface of the window frame facing the polymer film.

19. The package of claim 17 further including an electrically conductive adhesive coupling the second and third patterns of electrical conductors.

20. The package of claim 17 wherein the adhesive layer comprises an anisotropic adhesive material.

21. The package of claim 18 wherein the polymer film and the adhesive layer have at least one third via extending therethrough to the third pattern of electrical conductors and wherein the first pattern of electrical conductors includes at least one third portion extending through the at least one third via to the third pattern of electrical conductors.

22. The package of claim 21 wherein the window frame includes at least one electrically conductive element extending therethrough and wherein the third pattern of electrical conductors is electrically coupled to the at least one electrically conductive element.

23. The package of claim 5 wherein the polymeric passivation layer includes passivation vias extending to the pattern of electrical conductors and further including bonding pads coupled to the pattern of electrical conductors through the passivation vias.

24. The package of claim 6 further including a polymeric passivation layer over a surface of the window frame facing away from the polymer film.

25. The package of claim 7 wherein the polymer film and the adhesive layer include passive device vias extending to the at least one passive electrical device and wherein the pattern of electrical conductors includes passive device portions extending into the passive device vias.

26. An integrated circuit package comprising:

a polymer film;

at least one integrated circuit element having connection pads and having a connection pad surface coupled to the polymer film, the polymer film having vias extending therethrough to at least some of the connection pads;

an integrated circuit package window frame coupled to the polymer film and having at least one opening surrounding the at least one integrated circuit element, the window frame including at least one electrically conductive element;

polymeric encapsulant material positioned between the at least one integrated circuit element and the window frame;

a pattern of electrical conductors on a surface of the polymer film, the pattern of electrical conductors electrically coupling at least one of the connection pads to the at least one electrically conductive element.

* * * * *